United States Patent
Sun (10) Patent No.: US 10,516,395 B2
(45) Date of Patent: Dec. 24, 2019

(54) KEY STRUCTURE OF ELECTRONIC DEVICE

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Lei Sun, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/009,367

(22) Filed: Jun. 15, 2018

(65) Prior Publication Data

US 2019/0229730 A1   Jul. 25, 2019

(30) Foreign Application Priority Data

Jan. 25, 2018   (CN) .......................... 2018 1 0073462

(51) Int. Cl.
| | |
|---|---|
| *H01H 13/14* | (2006.01) |
| *H03K 17/975* | (2006.01) |
| *H01H 13/50* | (2006.01) |
| *H01H 13/20* | (2006.01) |

(52) U.S. Cl.
CPC ............ *H03K 17/975* (2013.01); *H01H 13/14* (2013.01); *H01H 13/20* (2013.01); *H01H 13/50* (2013.01); *H01H 2233/07* (2013.01)

(58) Field of Classification Search
CPC ............. H03K 17/962; H03K 17/9622; H03K 2217/960755; H03K 17/975; H03K 2017/9602; H03K 2017/9613; G06F 3/0362; G06F 1/163; G06F 3/0488; G06F 3/044; G06F 3/03545; G06F 1/1626; G06F 2203/04103; G06F 2203/04106; G06F 3/0346; G06F 3/0414; G06F 3/0418; G06F 3/0421
See application file for complete search history.

(56) References Cited

U.S. PATENT DOCUMENTS

2015/0341031 A1* 11/2015 Marquas ............... G01D 5/2417
200/600

\* cited by examiner

*Primary Examiner* — Ahmed M Saeed
(74) *Attorney, Agent, or Firm* — ScienBiziP, P.C.

(57) ABSTRACT

A key structure of an electronic device includes a connecting portion and a key portion. The connecting portion includes two electrode plates cooperatively defining an accommodating space. The key portion, when pressed, is moved toward the accommodating space and partially received within the accommodating space, thereby changing a capacitance between the two electrode plates. The key portion partially protrudes from the housing.

16 Claims, 8 Drawing Sheets

KEY STRUCTURE OF ELECTRONIC DEVICE

CROSS-REFERENCE TO RELATED APPLICATIONS

This application claims priority to Chinese Patent Application No. 201810073462.4 filed on Jan. 25, 2018, the contents of which are incorporated by reference herein.

FIELD

The subject matter herein generally relates to a key structure of an electronic device.

BACKGROUND

Generally, buttons of electronic devices may lose sensitivity or function over a long period of use.

BRIEF DESCRIPTION OF THE DRAWINGS

Implementations of the present disclosure will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 1:
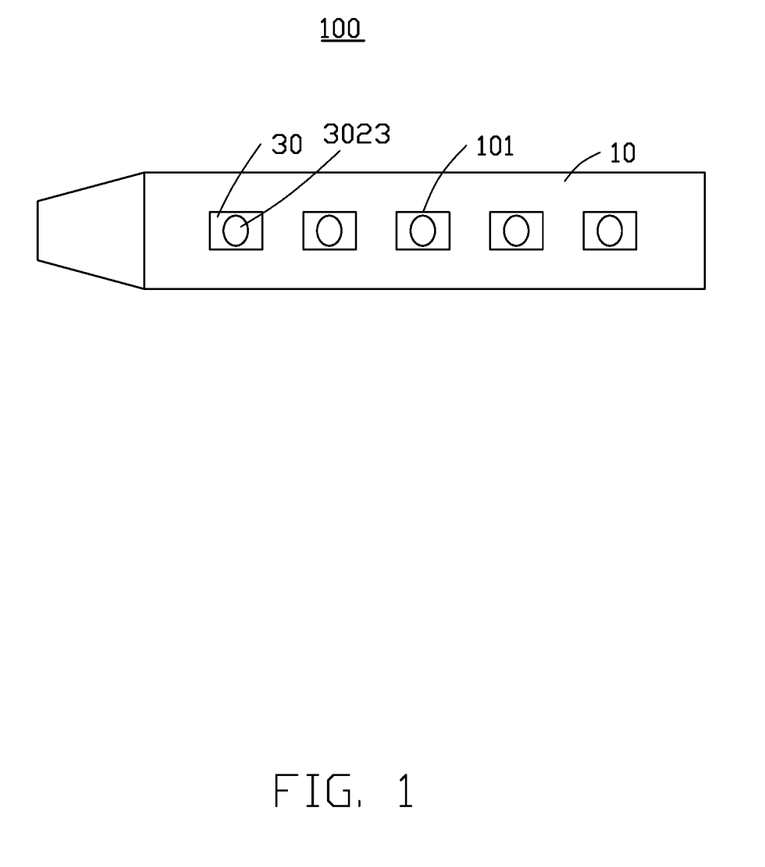
FIG. 1 is a diagram of an exemplary embodiment of an electronic device having a key structure in accordance with an embodiment of the present disclosure.

FIG. 1 illustrates an embodiment of an electronic device 100. The electronic device 100 may be a remote control, a keyboard, a smart watch, a smart phone, or the like. In at least one embodiment, the electronic device 100 is a remote control.

Figure 2:
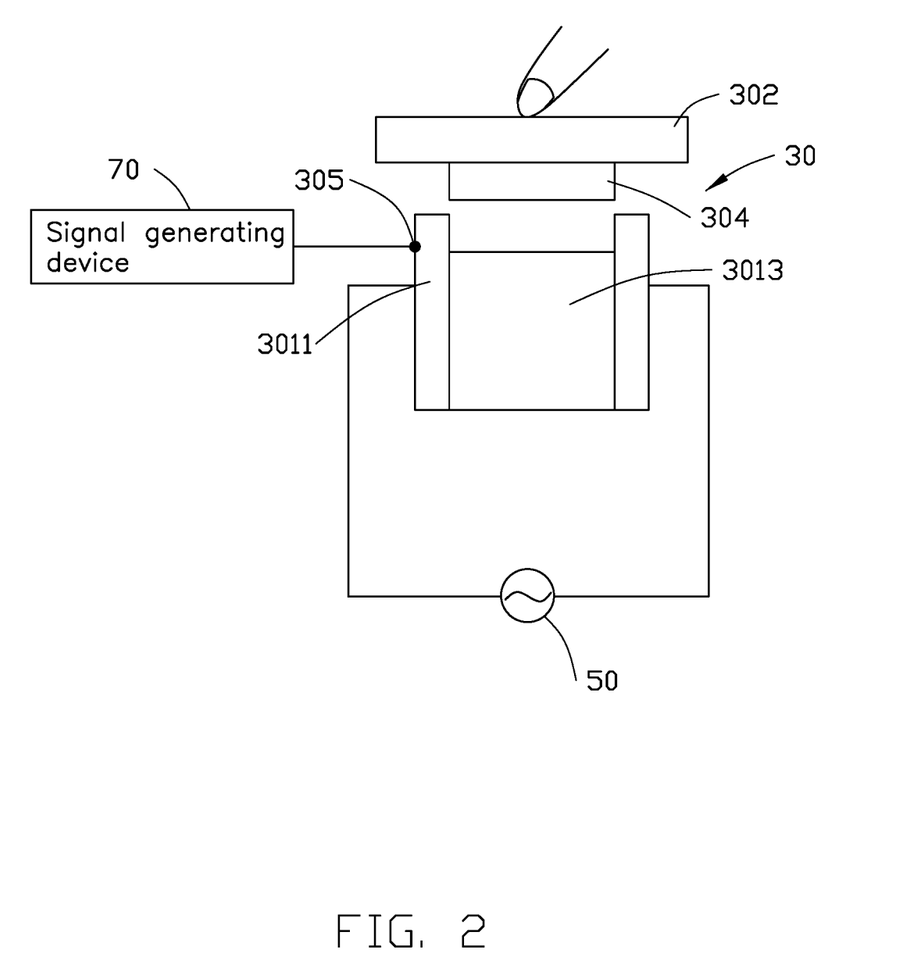
FIG. 2 is a diagram of the key structure in FIG. 1.

Referring to FIG. 2, the electronic device 100 includes at least one housing 10, at least one key structure 30, a power source 50, and a signal generating device 70. The key structure 30 partially protrudes from an outer surface of the housing 10. The power source 50 provides power for the electronic device 100. The power source 50 and the signal generating device 70 are located inside the housing 10 and electrically coupled to the key structure 30.

The housing 10 defines at least one opening 101. The key structure 30 partially protrudes out of the housing 10 through the opening 101. Thus, the key structure 30 may be easily operated by a user.

Figure 3:
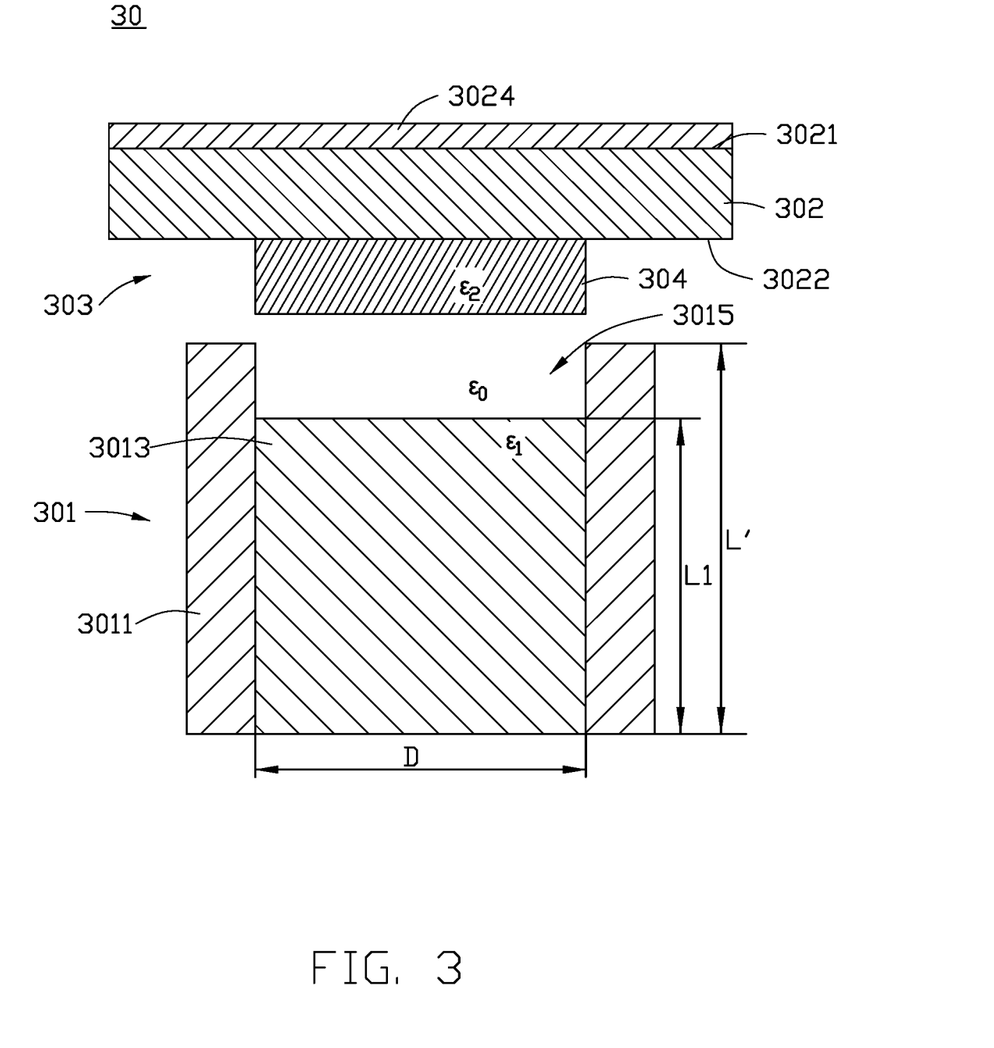
FIG. 3 is another diagram of the key structure in FIG. 1.

Referring to FIG. 3, in at least one embodiment, the key structure 30 includes at least one connecting portion 301 and a key portion 303.

The connecting portion 301 is located on the housing 10. In at least one embodiment, the connecting portion 301 includes two electrode plates 3011 and a filler 3013. The two electrode plates 3011 are oppositely arranged and substantially parallel to each other. The two electrode plates 3011 cooperatively define an accommodating space 3015. The accommodating space 3015 is partially or completely filled in by the filler 3013. The filler 3013 may be a solid dielectric material, such as diamond, sulphur, or polyvinyl chloride, for example. In another embodiment, the filler 3013 may be air or other gaseous material.

The key portion 303 may move relative to the connecting portion 301. In at least one embodiment, the key portion 303 includes a pressing portion 302 and a key column 304. The pressing portion 302 partially protrudes out of the housing 10, through the opening 101, to be pressed by a user to operate the key structure 30. The pressing portion 302 includes an upper surface 3021 and a lower surface 3022. The lower surface 3022 is opposite from the upper surface 3021. In detail, the upper surface 3021 includes a pressing area 3023 (shown in FIG. 1). A shape of the pressing area 3023 corresponds to a shape of a fingertip and may protrude from or be recessed in the upper surface 3021. Thus, a user may easily feel a location of the key structure 30.

The upper surface 3021 further includes an insulating layer 3024. The insulating layer 3024 covers the upper surface 3021 and prevents disturbance from adjacent key structures 30. The insulating layer 3024 also covers the pressing area 3023.

In at least one embodiment, the pressing portion 302 is made of substantially elastic material, such as rubber. In this way, when the pressing portion 302 is released after being pressed, the pressing portion 302 can automatically restore.

The key column 304 is located on the lower surface 3022 and corresponds to the accommodating space 3015. When the pressing portion 302 is pressed, the pressing portion 302 drives the key column 304 to move toward the accommodating space 3015. When the pressing portion 302 is released, the key column 304 moves away from the accommodating space 3015.

Referring again to FIG. 2, the key structure 30 further includes a connecting member 305. In at least one embodiment, the connecting member 305 is a metal contact. The connecting portion 301 is electrically coupled to the connecting member 305, and the connecting portion 301 is electrically coupled to the signal generating device 70 through the connecting member 305.

Referring again to FIG. 3, in at least one embodiment, the accommodating space 3015 is partially filled in by the filler 3013. Thus, the accommodating space 3015 is filled in by the filler 3013 and air. The filler 3013 fills in the accommodating space 3015 away from the key portion 303. A size of the key column 304 is substantially the same as a size of the accommodating space 3015. In this way, the key column 304 may be accommodated in a portion of the accommodating space 3015 not filled in by the filler 3013.

Figure 4:
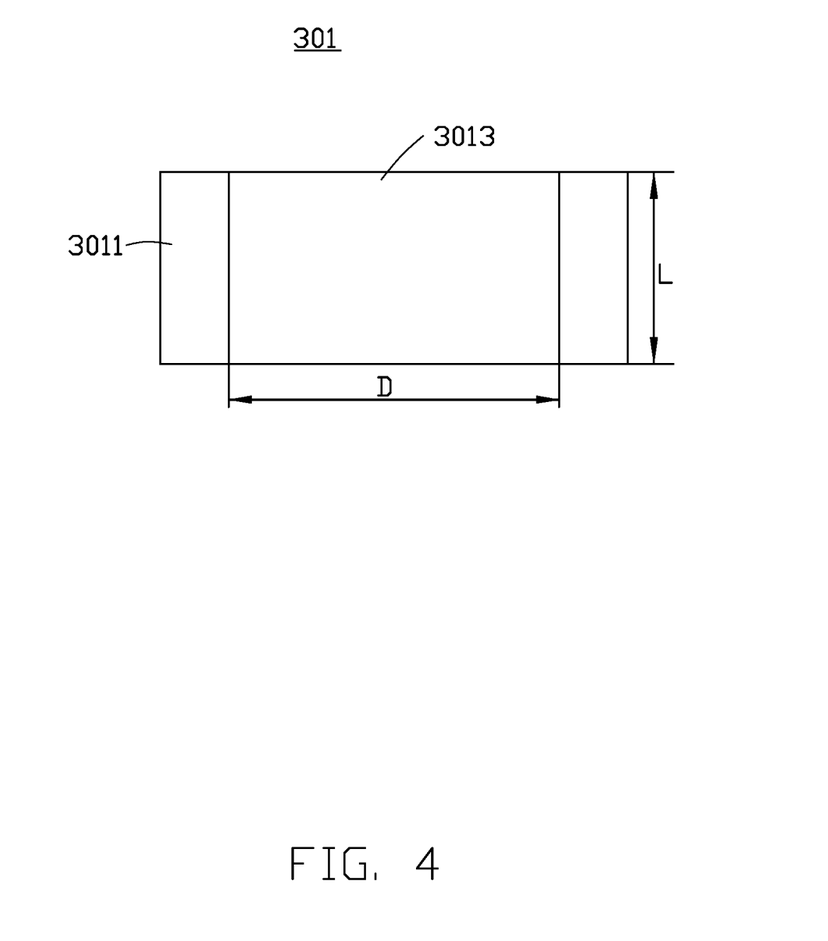
FIG. 4 is a diagram of electrode plates of the key structure.

Referring to FIG. 4, the electrode plates 3011 include a length "L" and a height "L". A height of the accommodating space 3015 filled in by the filler 3013 is "$L_1$". A height of the accommodating space 3015 filled in by air is $L'-L_1$. A distance between the two electrode plates 3011 is "D". The dielectric constant of air is "$\varepsilon_0$". The dielectric constant of the filler 3013 is "$\varepsilon_1$". The dielectric constant of the key column 304 is "$\varepsilon_2$".

When the pressing portion 302 is not pressed, the accommodating space 3015 accommodates air and the filler 3013 therein. Thus, a capacitance between the two electrode plates 3011 is expressed by equation (1):

$$C_1 = \frac{\varepsilon_1 * L * L_1 + \varepsilon_0 * L * (L' - L_1)}{4\pi k D} \quad (1)$$

wherein "k" is the electrostatic constant equal to $9.0*10^9$ $Nm^2/C^2$.

Figure 5:
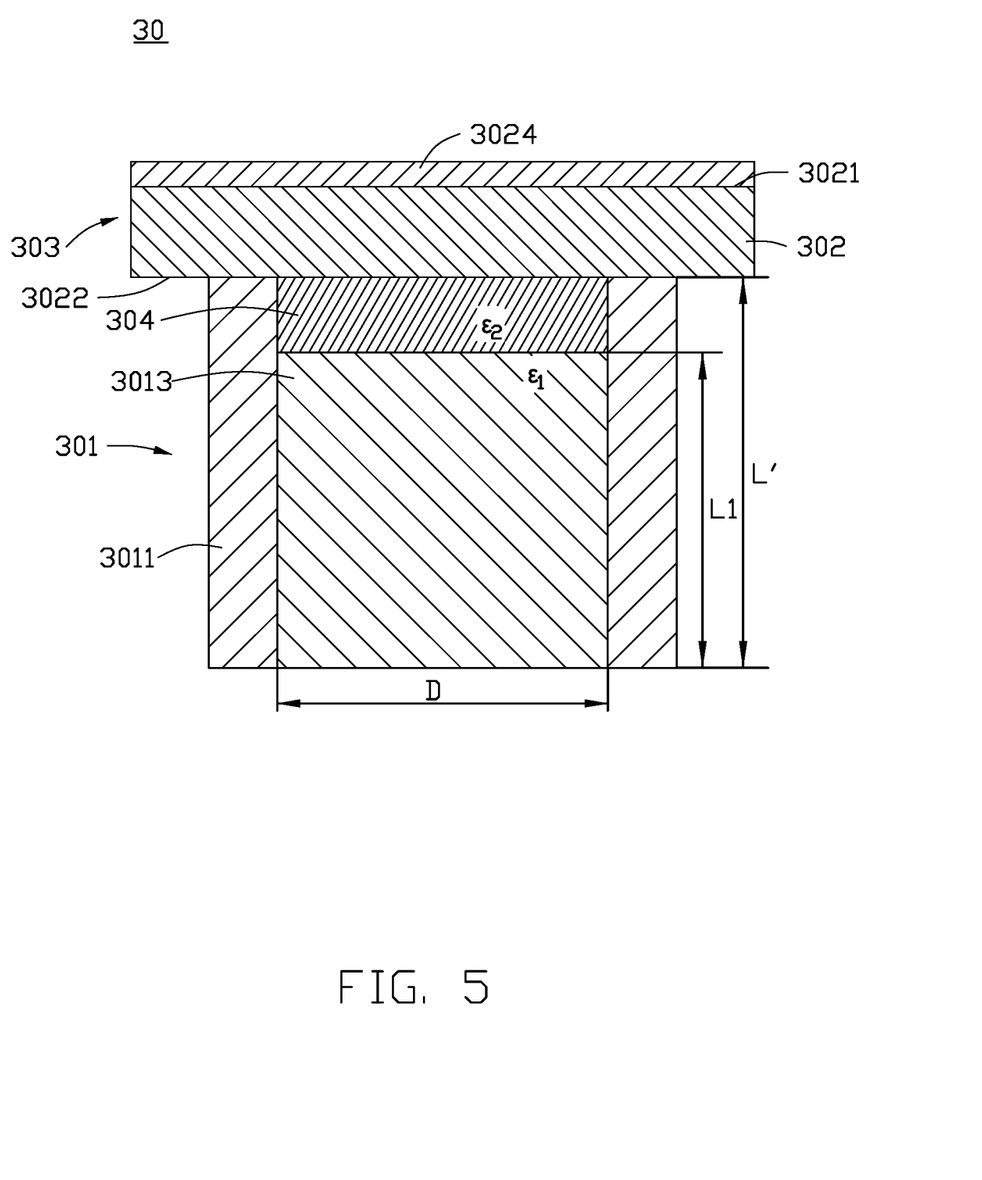
FIG. 5 is another diagram of the key structure in FIG. 1.

Referring to FIG. 5, when the pressing portion 302 is pressed, a capacitance $C_0$ is generated by a fingertip of the user, and the accommodating space 3015 accommodates the key column 304 and the filler 3013. Thus, a capacitance between the two electrode plates 3011 is expressed by equation (2):

$$C_1' = \frac{\varepsilon_1 * L * L_1 + \varepsilon_2 * L * (L' - L_1)}{4\pi k D} + C_0 \quad (2)$$

Thus, a change in capacitance $\Box C_1$ by pressing the pressing portion 302 is expressed by equation (3):

$$\Delta C_1 = C_1' - C_1 = \frac{(\varepsilon_2 - \varepsilon_0) * L * (L' - L_1)}{4\pi k D} + C_0 \quad (3)$$

According to equation (3), when the pressing portion 302 is pressed, the pressing portion 302 drives the key column 304 to move toward the connecting portion 301, and the key column 304 is accommodated within the portion of the accommodating space 3015 not occupied by the filler 3013, thereby changing the capacitance between the electrode plates 3011. The change in capacitance is output by the signal generating device 70 to generate a corresponding key signal.

Furthermore, because of differences in mechanical properties of materials, the key column 304 and the filler 3013 of different key structures 30 may be made of different materials, and a size of the power source 50 may be different to generate different key signals to achieve different functions of the key structures 30.

Figure 6:
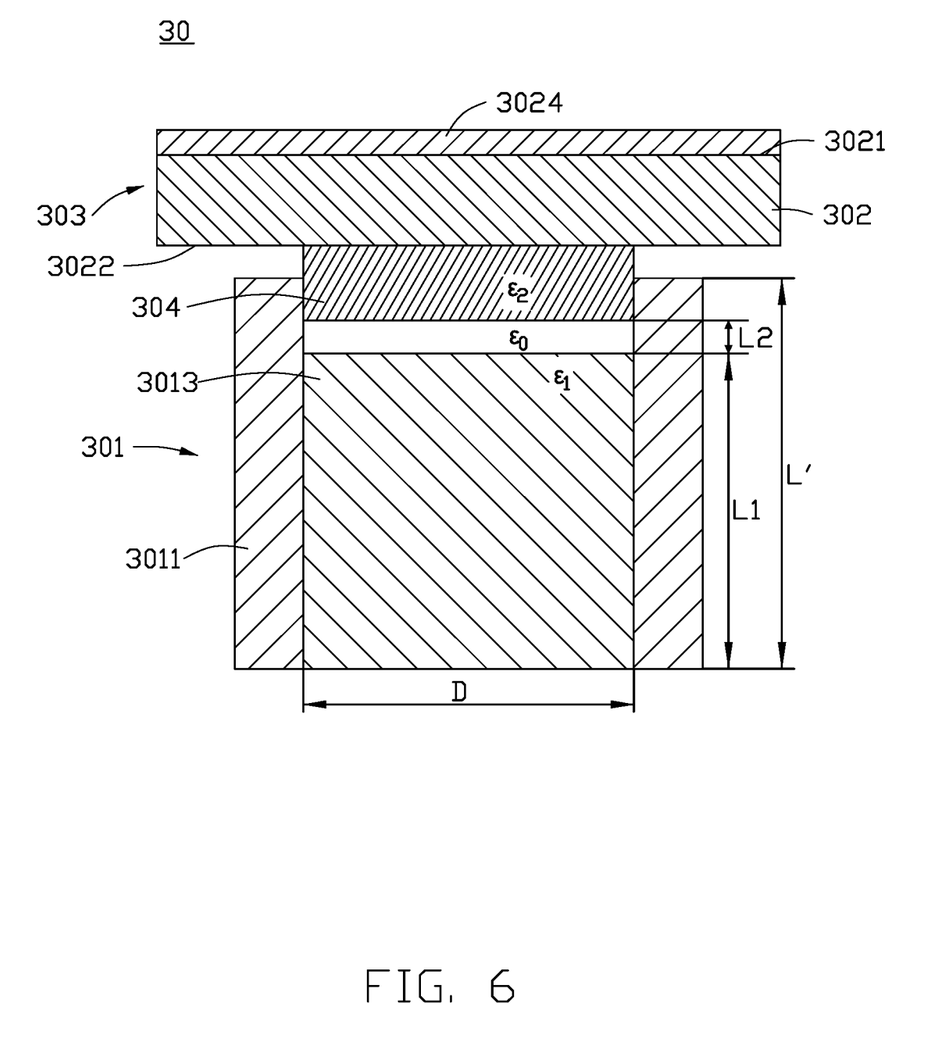
FIG. 6 is another diagram of the key structure in FIG. 1.

Referring to FIG. 6, in at least one embodiment, the filler 3013 and the key column 304 partially fill in the accommodating space 3015. Thus, the accommodating space 3015 is filled in by the filler 3013, the key column 304, and air. A size of the key column 304 is substantially equal to a size of the accommodating space 3015, and the key column 304 may fill in the portion of the accommodating space 3015 occupied by air. A height of the accommodating space 3015 occupied by the filler 3013 is "$L_1$", a height of the accommodating space 3015 occupied by air is "$L_2$", and a height of the accommodating space 3015 occupied by the key column 304 is "$L'-L_1-L_2$".

When the pressing portion 302 is not pressed, a capacitance $C_2$ between the electrode plates 3011 is represented by formula (4):

$$C_2 = \frac{\varepsilon_2 * L * (L' - L_1 - L_2) + \varepsilon_1 * L * L_1 + \varepsilon_0 * L * L_2}{4\pi k D} \quad (4)$$

Referring to FIG. 5, when the pressing portion 302 is pressed, a capacitance $C_0$ is generated by a fingertip of the user. The accommodating space 3015 accommodates the filler 3013 and the key column 304, and a capacitance $C_2'$ between the electrode plates 3011 is represented by formula (5):

$$C_2' = \frac{\varepsilon_1 * L * L_1 + \varepsilon_2 * L * (L' - L_1)}{4\pi k D} + C_0 \quad (5)$$

Thus, a change in capacitance $\Box C_2$ by pressing the pressing portion 302 is expressed by equation (6):

$$\Delta C_2 = C_2' - C_2 = \frac{(\varepsilon_2 - \varepsilon_0) * L * L_2}{4\pi k D} + C_0 \quad (6)$$

According to equation (6), when the pressing portion 302 is pressed, the pressing portion 302 drives the key column 304 to move toward the connecting portion 301, and the key column 304 is accommodated within the portion of the accommodating space 3015 previously occupied by air, thereby changing the capacitance between the electrode plates 3011. The change in capacitance is output by the signal generating device 70 to generate a corresponding key signal.

Furthermore, as shown in equation (6), the distance D between the electrode plates 3011 may be changed, the key column 304 may be made of a material having a different dielectric constant, a height of the accommodating space 3015 occupied by air may be changed (and a corresponding height of the key column 304 may be changed) to change the change in capacitance between the electrode plates 3011, thereby generating different key signals to achieve different functions of the key structures 30.

Figure 7:
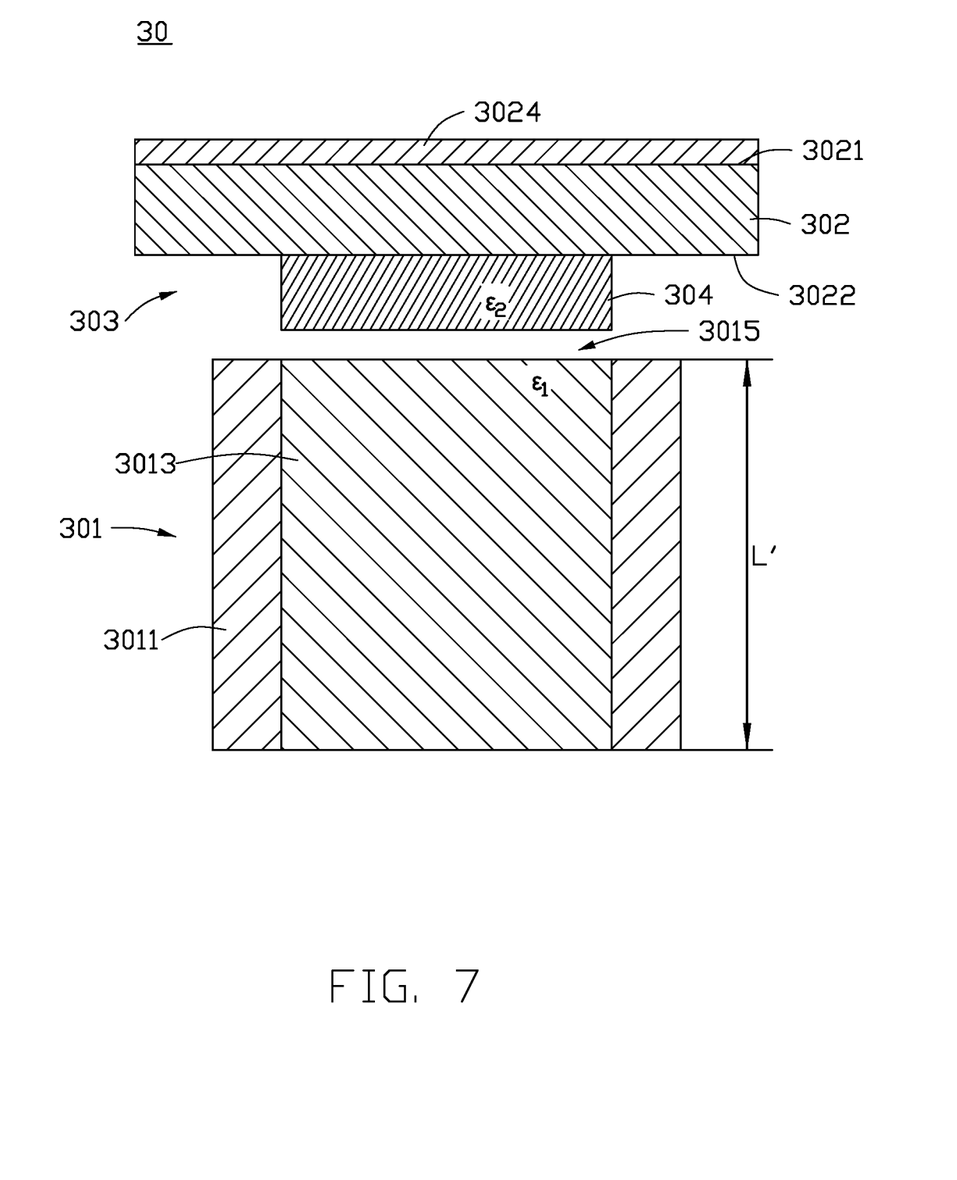
FIG. 7 is another diagram of the key structure in FIG. 1.

Referring to FIG. 7, in at least one embodiment, the accommodating space 3015 is completely filled in by the filler 3013.

When the pressing portion 302 is not pressed, the accommodating space 3015 only accommodates the filler 3013, and a capacitance between the dielectric plates 3011 is expressed by formula (7):

$$C_3 = \frac{\varepsilon_1 * L * L'}{4\pi kD} \quad (7)$$

Figure 8:
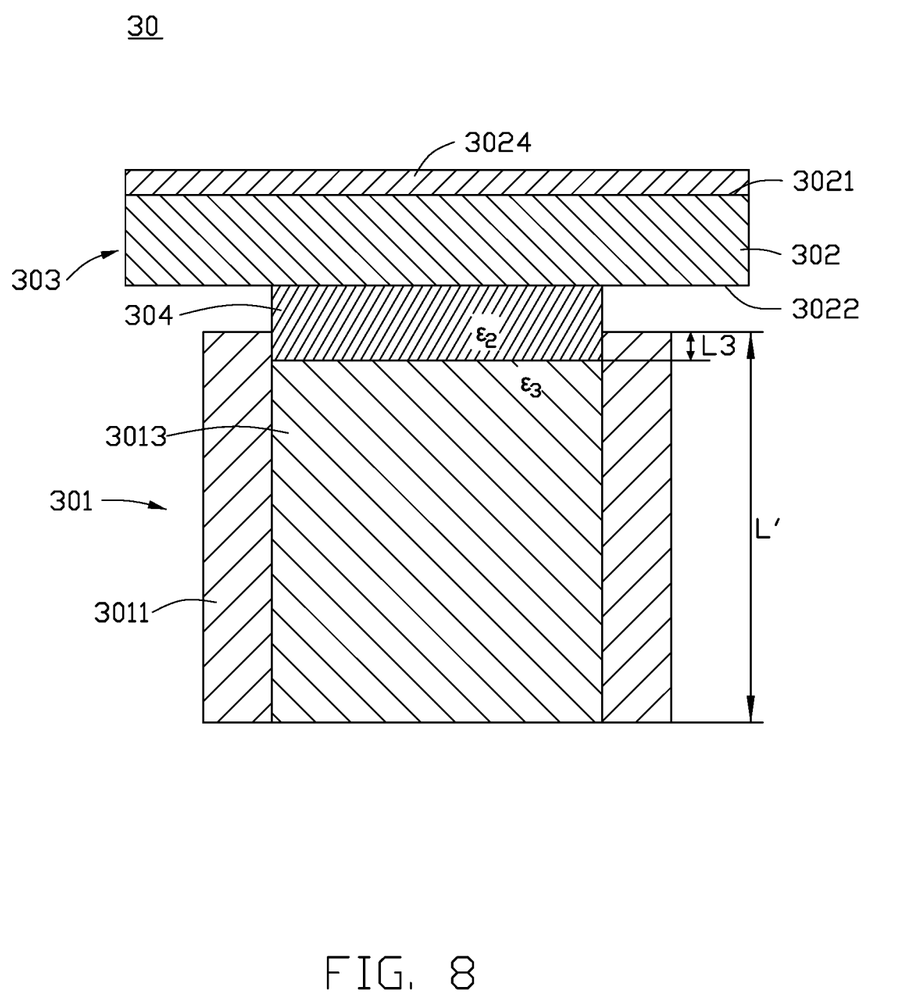
FIG. 8 is another diagram of the key structure in FIG. 1.

Referring to FIG. 8, when the pressing portion 302 is pressed, the key column 304 is moved toward the filler 3013 until the key column 304 presses against the filler 3013. Because the filler 3013 completely fills in the accommodating space 3015, the key column 304 displaces a portion of the filler 3013 within the accommodating space 3015, thereby deforming the filler 3013. Because the filler 3013 is deformed, the dielectric constant of the filler 3013 is changed to "$\varepsilon_3$". A height of the accommodating space 3015 occupied by the key column 304 is "$L_3$", and a height of the accommodating space 3015 occupied by the filler 3013 is "$L'-L_3$". A capacitance $C_3'$ between the electrode plates 3011 is represented by formula (8):

$$C_3' = \frac{\varepsilon_3 * L * (L' - L_3) + \varepsilon_2 * L * L_3}{4\pi kD} + C_0 \quad (8)$$

Thus, a change in capacitance $\Box C_3$ by pressing the pressing portion 302 is expressed by equation (9):

$$\Delta C_3 = C_3' - C_3 = \frac{(\varepsilon_2 - \varepsilon_3) * L * L_3 + (\varepsilon_3 - \varepsilon_1) * L * L'}{4\pi kD} + C_0 \quad (9)$$

According to equation (9), when the pressing portion 302 is pressed, the key column 304 is moved toward the filler 3013 until the key column 304 presses against the filler 3013. Because the filler 3013 completely fills in the accommodating space 3015, the key column 304 displaces a portion of the filler 3013 within the accommodating space 3015, thereby deforming the filler 3013. Thus, the capacitance between the electrode plates 3011 is changed. The change in capacitance between the electrode plates 3011 is output through the signal generating device 70 to generate a corresponding key signal.

Furthermore, as shown in equation (9), the distance D between the electrode plates 3011 may be changed, the key column 304 may be made of a material having a different dielectric constant, the filler 3013 may be made of a material having a different dielectric constant, or a pressure applied by the key column 304 on the filler 3013 may be changed (by changing $L_3$) to change the change in capacitance between the electrode plates 3011, thereby generating different key signals to achieve different functions of the key structures 30.

The key structure 30 is located on the housing 100 and protrudes from an outer surface of the housing 10. The pressing portion 302 is applied on the connecting portion 301 to change a capacitance between the electrode plates 3011. The change in capacitance is output through the signal generating device 70 to generate a corresponding key signal. Furthermore, the key column 304 and the filler 3013 may be made of different materials having different dielectric constants, or the power source 50 may have a different size to generate different key signals to achieve different functions of the key structure 30.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A key structure comprising:
   a connecting portion comprising two electrode plates cooperatively defining an accommodating space, wherein the connecting portion is filled in by a filler; and
   a key portion, which when pressed, is moved toward the accommodating space and partially received within the accommodating space, thereby changing a capacitance between the two electrode plates, wherein the key portion comprises a pressing portion and a key column; the key column is on a side of the pressing portion adjacent to the connecting portion; a size of the key column is equal to a size of the accommodating space; when the pressing portion is pressed, the key column is moved toward the accommodating space and presses the filler directly.

2. The key structure of claim 1, wherein the accommodating space of the connecting portion is partially filled in by a filler; the filler fills in the accommodating space away from the key portion; the key portion fills in a remaining portion of the accommodating space not filled in by the filler.

3. The key structure of claim 1, wherein the accommodating space of the connecting portion is completely filled in by a filler; the key portion, when pressed, displaces the filler in a portion of the accommodating space and causes the filler to deform.

4. The key structure of claim 1, wherein the pressing portion comprises an upper surface and a lower surface opposite to the upper surface; the pressing portion comprises a pressing area on the upper surface; the pressing area protrudes from or is recessed in the upper surface; the key column is on the lower surface.

5. The key structure of claim 4, wherein the pressing portion comprises an insulating layer on the upper surface covering the pressing area.

6. The key structure of claim 1, wherein the key column comprises a first contacting surface toward the filler, the filler comprise a second contacting surface, the second contacting surface is a plane, and the first contacting surface is perpendicular to a longitudinal direction of the key column.

7. The key structure of claim 6, wherein a size of an area of the first contacting surface is same as a size of an area of the second contacting surface, when the pressing portion is pressed, the first contacting surface and the second contacting surface are coplanar.

8. An electronic device comprising a housing and a key structure, the key structure comprising:
   a connecting portion comprising two electrode plates cooperatively defining an accommodating space, wherein the connecting portion is filled in by a filler;
   a key portion, which when pressed, is moved toward the accommodating space and partially received within the accommodating space, thereby changing a capacitance between the two electrode plates, wherein the key portion comprises a pressing portion and a key column; the key column is on a side of the pressing portion adjacent to the connecting portion; a size of the key column is equal to a size of the accommodating space;

when the pressing portion is pressed, the key column is moved toward the accommodating space and presses the filler directly; and wherein the key portion partially protrudes from the housing.

9. The electronic device of claim 8, further comprising a signal generating device electrically coupled to the connecting portion and configured to generate a corresponding key signal according to a change in capacitance between the two electrode plates.

10. The electronic device of claim 9, further comprising a connecting member electrically coupled to the connecting portion; wherein the connecting portion is electrically coupled to the signal generating device through the connecting member.

11. The electronic device of claim 10, wherein the accommodating space of the connecting portion is partially filled in by a filler; the filler fills in the accommodating space away from the key portion; the key portion fills in a remaining portion of the accommodating space not filled in by the filler.

12. The electronic device of claim 10, wherein the accommodating space of the connecting portion is completely filled in by a filler; the key portion, when pressed, displaces the filler in a portion of the accommodating space and causes the filler to deform.

13. The electronic device of claim 8, wherein the pressing portion comprises an upper surface and a lower surface opposite to the upper surface; the pressing portion comprises a pressing area on the upper surface; the pressing area protrudes from or is recessed in the upper surface; the key column is on the lower surface.

14. The electronic device of claim 13, wherein the pressing portion comprises an insulating layer on the upper surface covering the pressing area.

15. The electronic device of claim 13, wherein the key column comprises a first contacting surface toward the filler, the filler comprise a second contacting surface, the second contacting surface is a plane, and the first contacting surface is perpendicular to a longitudinal direction of the key column.

16. The electronic device of claim 15, wherein a size of an area of the first contacting surface is same as a size of an area of the second contacting surface, when the pressing portion is pressed, the first contacting surface and the second contacting surface are coplanar.

\* \* \* \* \*